(12) United States Patent
Lee

(10) Patent No.: US 11,480,615 B2
(45) Date of Patent: Oct. 25, 2022

(54) APPARATUS AND METHOD FOR ESTIMATING SOC OF BATTERY

(71) Applicant: LG CHEM, LTD., Seoul (KR)

(72) Inventor: Bom-Jin Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 396 days.

(21) Appl. No.: 16/610,204

(22) PCT Filed: Aug. 29, 2018

(86) PCT No.: PCT/KR2018/010005
§ 371 (c)(1),
(2) Date: Nov. 1, 2019

(87) PCT Pub. No.: WO2019/078477
PCT Pub. Date: Apr. 25, 2019

(65) Prior Publication Data
US 2021/0190865 A1 Jun. 24, 2021

(30) Foreign Application Priority Data
Oct. 20, 2017 (KR) .................. 10-2017-0136781

(51) Int. Cl.
*G01R 31/367* (2019.01)
*G01R 31/3842* (2019.01)
*H01M 10/48* (2006.01)

(52) U.S. Cl.
CPC ....... *G01R 31/367* (2019.01); *G01R 31/3842* (2019.01); *H01M 10/48* (2013.01)

(58) Field of Classification Search
CPC .. G01R 31/367; G01R 31/3842; H01M 10/48
See application file for complete search history.

(56) References Cited

U.S. PATENT DOCUMENTS 8,264,202 B2 9/2012 Sahu et al.
2005/0237024 A1 10/2005 Hogari et al.
(Continued)

FOREIGN PATENT DOCUMENTS

CN 103620432 A 3/2014
CN 104662766 A 5/2015
(Continued)

OTHER PUBLICATIONS

Extended European Search Report issued in corresponding European Patent App. No 18867378.4 dated May 4, 2020.
(Continued)

*Primary Examiner* — Natalie Huls
*Assistant Examiner* — Sharad Timilsina
(74) *Attorney, Agent, or Firm* — Morgan, Lewis & Bockius LLP

(57) ABSTRACT

An apparatus for estimating a state of charge (SOC) of a battery includes: a sensing unit configured to measure voltage, current and temperature of a battery; and a processor operably coupled to the sensing unit, and the processor performs: setting a first reference voltage based on a first SOC according to a voltage of the battery, which is calculated in advance using the current of the battery measured at every charge/discharge cycle of the battery; calculating a second SOC according to the voltage of the battery using an equivalent circuit model corresponding to the battery; setting a voltage region of the battery as a first voltage region and a second voltage region based on the first reference voltage; and estimating a SOC of the battery in each of the first voltage region and the second voltage region as any one of the first SOC and the second SOC.

14 Claims, 6 Drawing Sheets

(56) References Cited

U.S. PATENT DOCUMENTS

| | | | |
|---|---|---|---|
| 2008/0231238 A1* | 9/2008 | Wong | B60W 10/26 |
| | | | 320/161 |
| 2012/0215517 A1 | 8/2012 | Bohlen et al. | |
| 2012/0293131 A1 | 11/2012 | Nakamura et al. | |
| 2012/0310568 A1 | 12/2012 | Wang et al. | |
| 2013/0234672 A1 | 9/2013 | Kubota et al. | |
| 2013/0297243 A1 | 11/2013 | Baba et al. | |
| 2014/0074416 A1 | 3/2014 | Park et al. | |
| 2015/0212161 A1 | 7/2015 | Soga et al. | |
| 2015/0234013 A1 | 8/2015 | Migita et al. | |
| 2015/0035782 A1 | 12/2015 | Nakao et al. | |
| 2015/0357852 A1 | 12/2015 | Nakao et al. | |
| 2016/0259011 A1 | 9/2016 | Joe | |
| 2016/0274193 A1 | 9/2016 | Imaizumi | |
| 2017/0176540 A1 | 6/2017 | Omi et al. | |
| 2017/0200994 A1 | 7/2017 | Kim et al. | |
| 2017/0269165 A1 | 9/2017 | Takashima et al. | |
| 2018/0017628 A1* | 1/2018 | Takegami | G01R 31/367 |
| 2018/0088181 A1 | 3/2018 | Jiang et al. | |

FOREIGN PATENT DOCUMENTS

| | | | |
|---|---|---|---|
| CN | 107076802 A | | 8/2017 |
| JP | 2005-315730 A | | 11/2005 |
| JP | 2013-507628 A | | 3/2013 |
| JP | 2014-190723 A | | 10/2014 |
| JP | 2014-196985 A | | 10/2014 |
| JP | 2014190723 A | * | 10/2014 |
| JP | 2016-176780 A | | 10/2016 |
| JP | 5158195 B2 | | 7/2017 |
| JP | 5252875 B2 | | 12/2017 |
| KR | 10-0892821 B1 | | 4/2009 |
| KR | 10-2014-0070790 A | | 6/2014 |
| KR | 10-1465380 B1 | | 11/2014 |
| KR | 10-2016-0014165 A | | 2/2016 |
| KR | 10-2016-0063070 A | | 6/2016 |
| KR | 10-2017-0058165 A | | 5/2017 |
| KR | 10-2017-0084607 A | | 7/2017 |
| KR | 10-2017-0116427 A | | 10/2017 |
| WO | 2011/133863 A3 | | 2/2012 |
| WO | 2016/132813 A1 | | 8/2016 |
| WO | 2017/000912 A2 | | 1/2017 |

OTHER PUBLICATIONS

Office Action dated Sep. 29, 2020, issued in corresponding Japanese Patent Application No. 2019-561991.

Office Action dated Jul. 22, 2020, issued in corresponding Korean Patent Application No. 10-2017-0136781.

International Search Report issued in corresponding International Patent Application No. PCT/KR2018/010005, dated Dec. 20, 2018.

Office Action dated Apr. 21, 2021, issued in corresponding Chinese Patent Application No. 201880031696.0.

* cited by examiner

APPARATUS AND METHOD FOR ESTIMATING SOC OF BATTERY

TECHNICAL FIELD

The present application claims priority to Korean Patent Application No. 10-2017-0136781 filed on Oct. 20, 2017 in the Republic of Korea, the disclosures of which are incorporated herein by reference.

The present disclosure relates to an apparatus and method for estimating a state of charge (SOC) of a battery, and more particularly, to an apparatus and method for estimating a SOC of a battery by using a first SOC calculated for each charge/discharge cycle of the battery and a second SOC calculated using an equivalent circuit model.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, batteries allowing repeated charging and discharging are being actively studied.

Batteries commercially available at the present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

One of the important parameters in using and managing the battery is a state of charge (SOC). The SOC is a parameter representing a relative ratio of capacity at the present to a maximum capacity representing the electrical energy stored in the battery when the battery is fully charged. The SOC may be expressed as 0 to 1 or 0% to 100%.

An equivalent circuit model is representatively used to estimate the SOC of a battery.

The equivalent circuit model is designed to simulate electrical operating characteristics of a battery. However, the battery has nonlinear characteristics depending on the operating condition, and it is very difficult to design the equivalent circuit model to perfectly simulate the nonlinear characteristics of the battery.

Thus, when the SOC of the battery is estimated using the equivalent circuit model, the SOC with nonlinearity is estimated in a specific voltage region according to the operation state of the battery to be estimated. Thus, the accuracy of the estimated SOC of the battery is lowered.

DISCLOSURE

Technical Problem

The present disclosure is designed to solve the problems of the related art, and therefore the present disclosure is directed to providing an apparatus and method for estimating a SOC of a battery, which sets a battery voltage having a minimum SOC deviation of first SOCs calculated for each charge/discharge cycle of the battery as a first reference voltage, estimates a SOC of the battery as a first SOC in a battery voltage region equal to or lower than the first reference voltage, and estimates a SOC of the battery in a battery voltage region higher than the first reference voltage as a second SOC calculated using an equivalent circuit model.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for estimating a state of charge (SOC) of a battery, comprising: a sensing unit configured to measure voltage, current and temperature of a battery; and a processor operably coupled to the sensing unit.

Preferably, the processor may be configured to perform: setting a first reference voltage based on a first SOC according to a voltage of the battery, which is calculated in advance using the current of the battery measured at every charge/discharge cycle of the battery; calculating a second SOC according to the voltage of the battery using an equivalent circuit model corresponding to the battery; setting a voltage region of the battery as a first voltage region and a second voltage region based on the first reference voltage; and estimating a SOC of the battery in each of the first voltage region and the second voltage region as any one of the first SOC and the second SOC.

Preferably, the processor may perform: calculating a SOC deviation of the first SOCs for each charge/discharge cycle at every voltage of the battery; and setting the first reference voltage using the SOC deviation.

Preferably, the processor may set a voltage of the battery, at which the SOC deviation is minimum, as the first reference voltage.

Preferably, the processor may perform: setting a voltage region of the battery equal to or lower than the first reference voltage as the first voltage region; and setting a voltage region of the battery higher than the first reference voltage as the second voltage region.

Preferably, the processor may estimate the SOC of the battery in the first voltage region as a first SOC calculated at an initial charge/discharge cycle among the first SOCs.

Preferably, the processor may estimate the SOC of the battery in the second voltage region as the second SOC.

Preferably, the processor may perform: calculating a voltage change rate of the battery according to the second SOC; and setting a second reference voltage based on the increase and decrease of the voltage change rate.

Preferably, the processor may set a voltage of the battery, at which the voltage change rate increases and then decreases or decreases and then increases, as the second reference voltage.

Preferably, the processor may perform: setting a voltage region of the battery equal to or lower than the first reference voltage as the first voltage region; setting a voltage region higher than the second reference voltage as the second voltage region; and further setting a voltage region higher than the first reference voltage and equal to or lower than the second reference voltage as the first voltage region.

A battery pack according to the present disclosure may comprise the apparatus for estimating a SOC of a battery.

Advantageous Effects

According to the present disclosure, it is possible to accurately estimate a SOC of a battery by estimating a SOC of the battery in a voltage region where a second SOC calculated using the equivalent circuit model is calculated linearly as the second SOC, and estimating a SOC of the battery in a voltage region where the second SOC is calculated nonlinearly as a first SOC calculated through an charge/discharge experiment.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
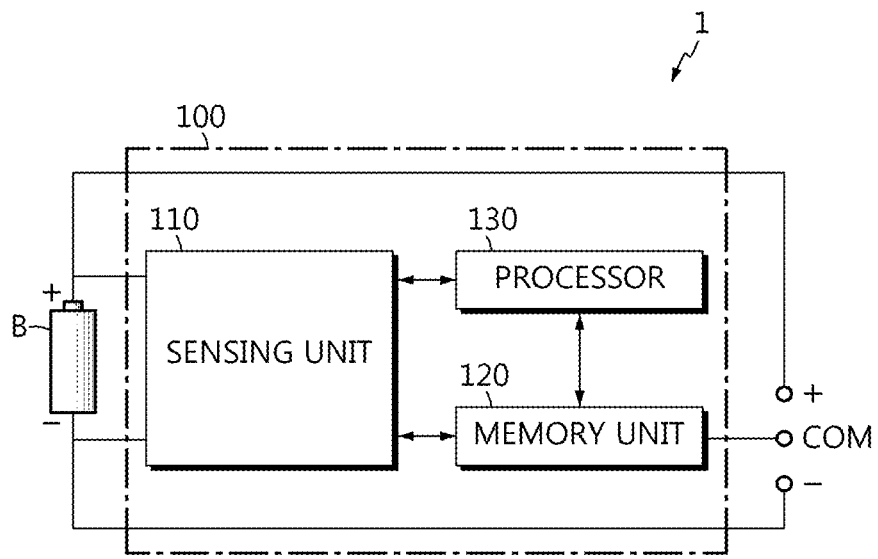
FIG. 1 is a diagram showing an apparatus for estimating a SOC of a battery (hereinafter, also referred to as a battery SOC estimation apparatus) according to an embodiment of the present disclosure.

FIG. 1 is a diagram showing an apparatus for estimating a SOC of a battery (hereinafter, also referred to as a battery SOC estimation apparatus) according to an embodiment of the present disclosure.

Referring to FIG. 1, the battery SOC estimation apparatus 100 according to an embodiment of the present disclosure is included in a battery pack 1 that has a battery B, and may be connected to the battery B to estimate a SOC of the battery B.

For this, the battery SOC estimation apparatus 100 may include a sensing unit 110, a memory unit 120 and a processor 130.

The battery B is a minimum unit battery from which the SOC is estimated, and includes a plurality of unit cells electrically connected in series and/or in parallel. The case where the battery B includes only one unit cell is also included in the scope of the present disclosure.

The unit cell is not particularly limited as long as it is capable of being repeatedly charged and discharged. For example, the unit cell may be a lithium polymer battery in a pouch type.

The battery B may be electrically coupled to a variety of external devices through an external terminal. The external device may be, for example, an electric vehicle, a hybrid electric vehicle, an unmanned aerial vehicle such as a drone, a large capacity electric power storage system (ESS) included in a power grid, or a mobile device. In this case, the battery B may include some or all of unit cells included in a modularized battery pack mounted to the external device.

The external terminal of the battery B may be selectively coupled to a charging device. The charging device may be selectively coupled to battery B by control of the external device to which the battery B is mounted.

The sensing unit 110 is operably coupled to the processor 130. That is, the sensing unit 110 may be connected to the processor 130 to transmit an electrical signal to the processor 130 or to receive an electrical signal from the processor 130.

The sensing unit 110 may repeatedly measure the voltage applied between the positive electrode and the negative electrode of the battery B and the current flowing into or out of the battery B at preset cycles and provide a measurement signal indicating the measured voltage and current to the processor 130.

The sensing unit 110 includes a current sensor configured to measure the current of the battery B. In addition, the sensing unit 110 may further include a voltage sensor configured to measure the voltage of the battery B. Moreover, the sensing unit 110 may further include a temperature sensor configured to measure the temperature of the battery B.

If a measurement signal is received from the sensing unit 110, the processor 130 may determine digital values of the voltage, temperature and current of the battery B, respectively, through signal processing and then store the digital values in the memory unit 120.

The memory unit 120 is a semiconductor memory device that records, erases and updates data generated by the processor 130, and stores a plurality of program codes for estimating the SOC of the battery B. In addition, the memory unit 120 may store preset values of various predetermined parameters used in implementing the present disclosure.

Figure 2:
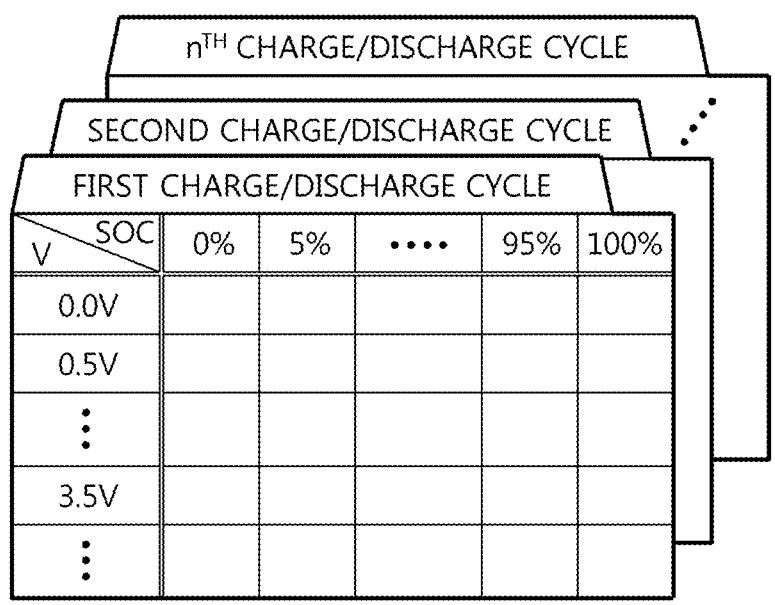
FIG. 2 is a diagram showing an example of a "look-up table of open circuit voltage (OCV) and the first SOC at each charge/discharge cycle" used for the battery SOC estimation apparatus depicted in FIG. 1 to set a first reference voltage.
Figure 3:
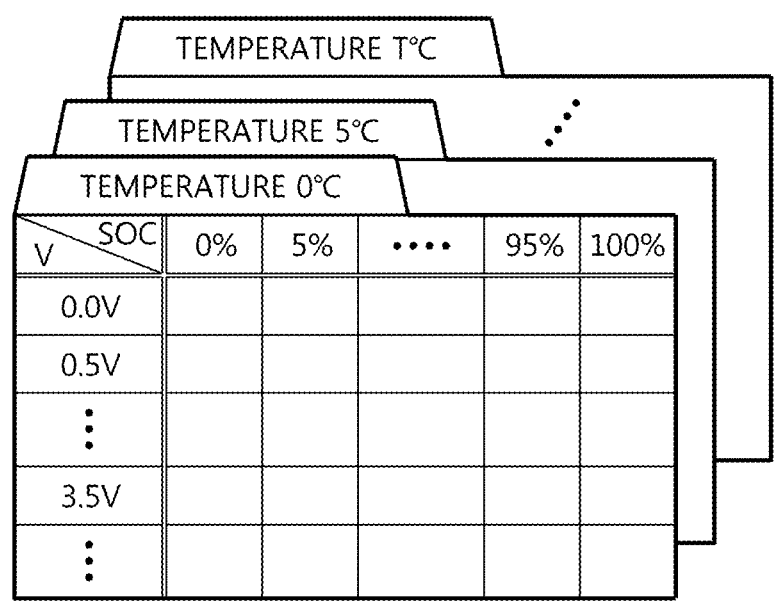
FIG. 3 a diagram showing an example of a "look-up table of OVC and the first SOC at each temperature" used for the battery SOC estimation apparatus depicted in FIG. 1 to calculate a second SOC.

FIG. 2 is a diagram showing an example of a "look-up table of open circuit voltage (OCV) and the first SOC at each charge/discharge cycle" used for the battery SOC estimation apparatus depicted in FIG. 1 to set a first reference voltage, and FIG. 3 a diagram showing an example of a "look-up table of OVC and the first SOC at each temperature" used for the battery SOC estimation apparatus depicted in FIG. 1 to calculate a second SOC.

Referring to FIGS. 2 and 3 further, the memory unit 120 may store the first SOC according to the voltage of the battery B, calculated in advance using the current of the battery B measured for every charge/discharge cycle of the battery B. More specifically, as shown in FIG. 2, the memory unit 120 may store the first SOC calculated in advance using a charge/discharge current and a charge/discharge time of the battery B, measured at every charge/discharge cycle through a charge/discharge experiment of the battery B, and a maximum capacity of the battery B. At this time, the memory unit 120 may store a "look-up table of OCV and the first SOC at each charge/discharge cycle" where the voltage of the battery B corresponding to the first SOC is mapped therewith.

In addition, as shown in FIG. 3, the memory unit 120 may store the "OCV-SOC look-up table at each temperature", which is used by the processor 130, explained later, to calculate a second SOC of the battery B. In the "OCV-SOC look-up table at each temperature", the voltage of the battery B corresponding to the SOC of the battery B may be mapped at each temperature of the battery B.

The memory unit 120 may is not particularly limited as long as it is a semiconductor memory element known in the art as being capable of recording, erasing and updating data. For example, the memory unit 120 may be DRAM, SDRAM, a flash memory, ROM, EEPROM, a register, and the like. In addition, the memory unit 120 may further include a storage medium that stores program codes defining the control logics of the processor 130. The storage medium includes a non-volatile storage element such as a flash memory or a hard disk. The memory unit 120 may be physically separate from the processor 130 or may be integrated with the processor 130.

Referring to FIG. 1 again, the processor 130 may be operably coupled to the sensing unit 110. The processor 130 may set a first reference voltage based on the first SOC according to the voltage of the battery B, calculated in advance using the current of the battery B measured at every charge/discharge cycle of the battery B. In addition, the processor 130 may calculate the second SOC according to the voltage of the battery B using an equivalent circuit model corresponding to the battery B. Moreover, the processor 130 may set a voltage region of the battery B as a first voltage region and a second voltage region based on the first reference voltage, and estimate the SOC of the battery B at each of the first voltage region and the second voltage region as any one of the first SOC and the second SOC.

The processor 130 may transmit a message indicating the estimated SOC to an external device via a communication terminal COM.

The processor 130 may selectively include an application-specific integrated circuit (ASIC), another chipset, a logic circuit, a register, a communication modem, and a data processing device. At least one of the various control logics executable by the processor 130 may be combined, and the combined control logic is written in a computer-readable code system and recorded on a computer-readable recording medium. The recording medium has no limitation as long as it can be accessed by the processor 130 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

Hereinafter, the process in which the processor 130 sets the first reference voltage based on the first SOC of the battery B and sets the first voltage region and the second voltage region based on the set first reference voltage will be described.

Figure 4:
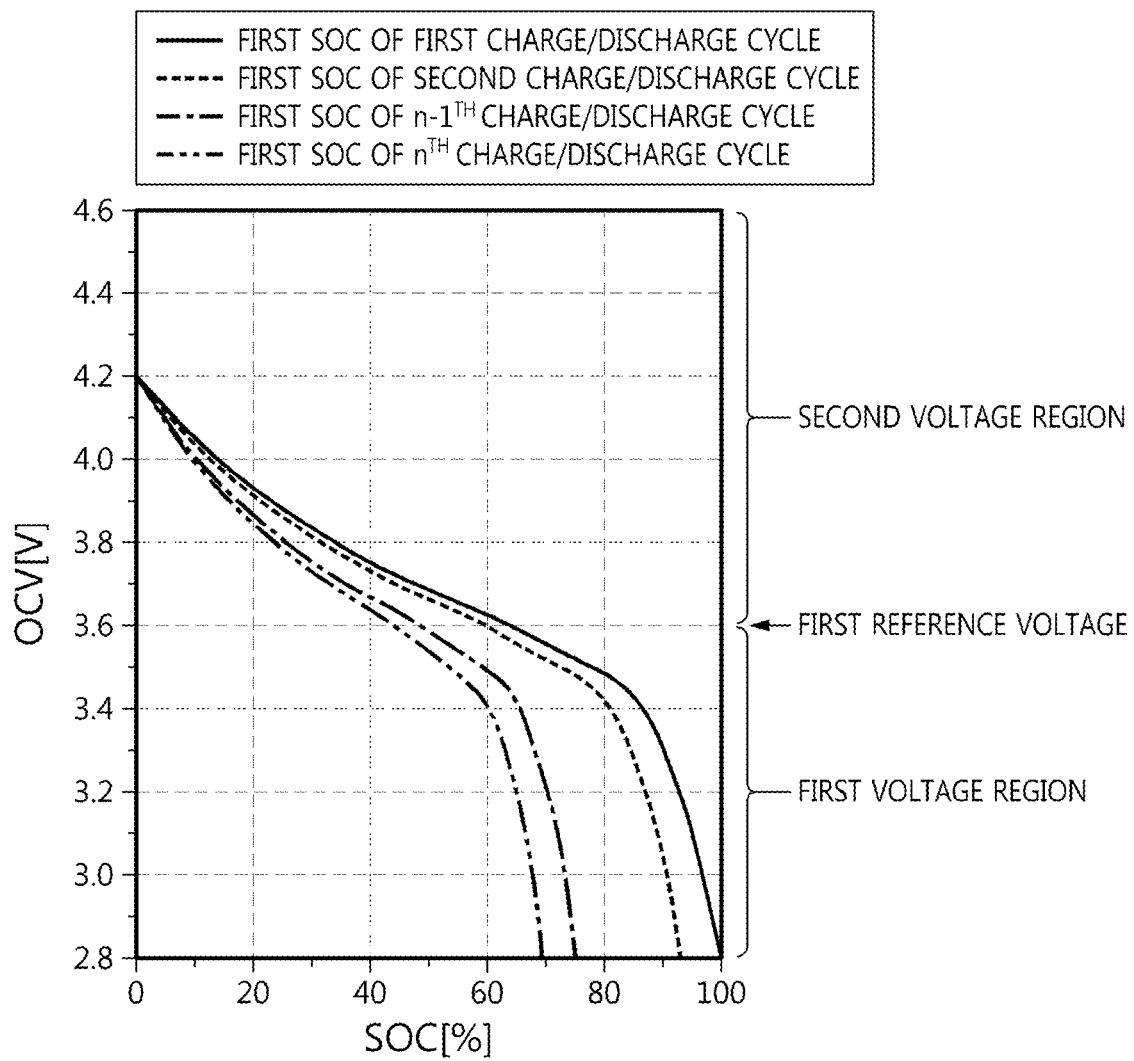
FIG. 4 is a graph showing the "look-up table of OCV and the first SOC at each charge/discharge cycle" depicted in FIG. 2.

FIG. 4 is a graph showing the "look-up table of OCV and the first SOC at each charge/discharge cycle" depicted in FIG. 2.

Referring to FIG. 4 further, the processor 130 may set the first reference voltage based on the first SOC of the battery B.

Here, the first SOC of the battery B may be calculated in advance using the charge/discharge current and the charge/discharge time of the battery B measured at every charge/discharge cycle through the charge/discharge experiment of the battery B and the maximum capacity of the battery B, and stored in the memory unit 120. In addition, as described above, the first SOC of the battery B may be mapped to the corresponding voltage of the battery B and stored in the memory unit 120 as a "look-up table of OCV and the first SOC at each charge/discharge cycle".

As shown in FIG. 4, the data of the "look-up table of OCV and the first SOC at each charge/discharge cycle" may be expressed as an OCV-SOC where an X axis represents the first SOC and a Y axis represents the OCV for each charge/discharge cycle.

At this time, the processor 130 may calculate a SOC deviation of the first SOCs for each charge/discharge cycle at every voltage of the battery B, and set the first reference voltage using the SOC deviation.

For example, if the SOC deviation of the first SOCs is calculated for each charge/discharge cycle with respect to a voltage "3V", the processor 130 may read the first SOC of the battery B, which respectively corresponds to the voltage "3V" of the battery B at each of first to $n^{th}$ charge/discharge cycles, from the memory unit 120.

After that, the processor 130 may calculate a deviation of the first SOCs of the battery B corresponding to the voltage "3V" of the battery B at the other second to $n^{th}$ charge/discharge cycles based on the first SOC of the battery B corresponding to the voltage "3V" of the battery B at the first charge/discharge cycle as the SOC deviation.

At this time, the processor 130 may calculate the SOC deviation using Equation 1 below.

$$D_V = \frac{(SOC1_{1V} - SOC1_{2V}) + (SOC1_{1V} - SOC1_{3V}) + \ldots + (SOC1_{1V} - SOC1_{nV})}{n} \quad \langle\text{Equation 1}\rangle$$

Here, $D_v$ represents the SOC deviation with respect to a voltage "V" of the battery B, $SOC1_{nV}$ represents a first SOC of the battery B corresponding to the voltage "V" of the battery B at an $n^{th}$ charge/discharge cycle, and n represents the number of total charge/discharge cycles.

As described above, the processor 130 may calculate the SOC deviation among the first SOCs for each charge/discharge cycle at every voltage of battery B with respect to all voltage regions of the battery B.

After that, the processor 130 may set the voltage of the battery B, which is smallest among the SOC deviations calculated for each voltage of the battery B, as the first reference voltage.

Meanwhile, the processor 130 may set the voltage region of the battery B as the first voltage region and the second voltage region based on the set first reference voltage. More specifically, the processor 130 may set the voltage region of the battery B equal to or lower than the first reference voltage as the first voltage region and set the voltage region higher than the first reference voltage as the second voltage region.

For example, as shown in FIG. 4, if a smallest value among the SOC deviations calculated at each voltage of the battery B is calculated at a voltage "3.6V" of the battery B, the processor 130 may set the voltage "3.6V" of the battery B as the first reference voltage.

After that, the processor 130 may set a voltage region of the battery B equal to or lower than the first reference voltage "3.6V" as the first voltage region and set a voltage region higher than the first reference voltage "3.6V" as the second voltage region.

Hereinafter, the process where the processor 130 calculates the second SOC of the battery B and sets the second reference voltage will be described.

Figure 5:
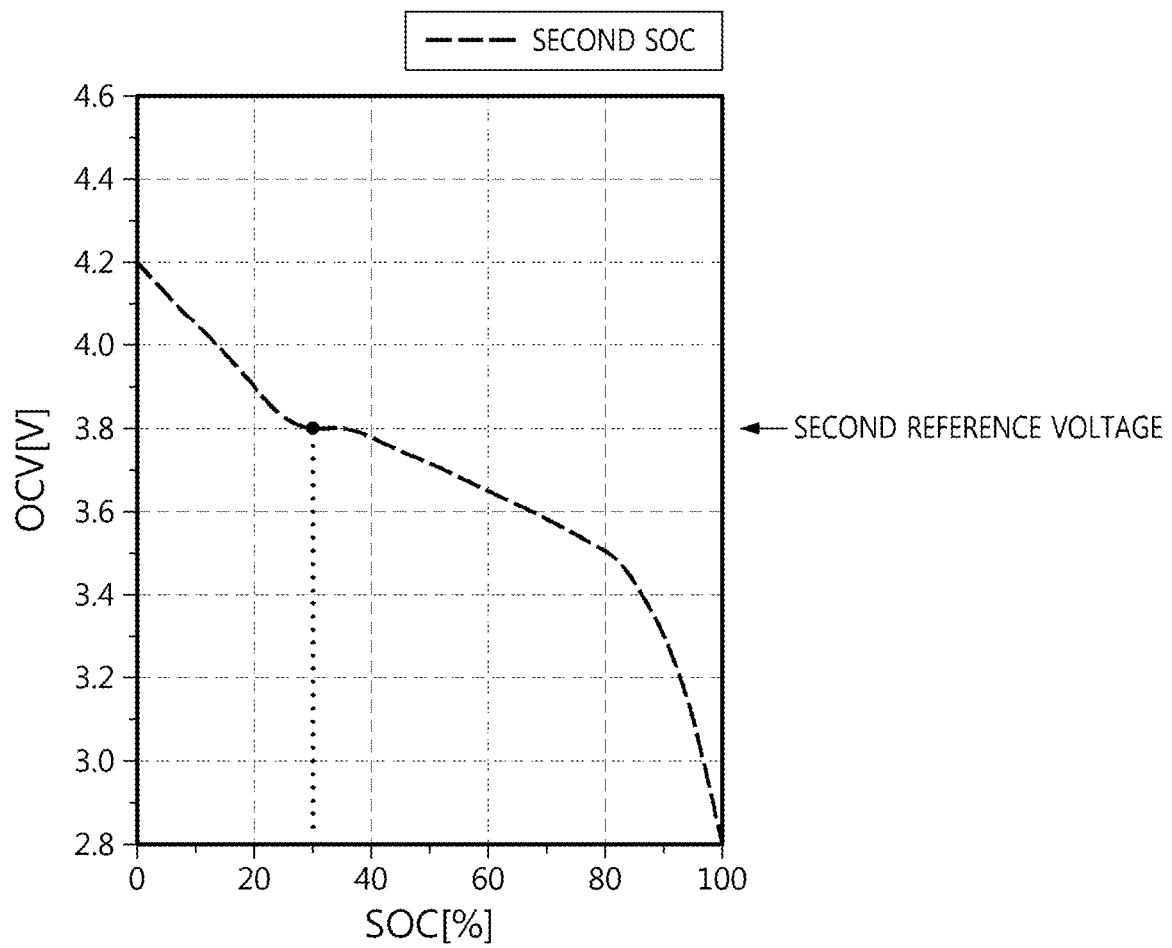
FIG. 5 is a graph showing the second SOC, calculated by the battery SOC estimation apparatus depicted in FIG. 1, according to a voltage.

FIG. 5 is a graph showing the second SOC, calculated by the battery SOC estimation apparatus depicted in FIG. 1, according to a voltage.

Referring to FIG. 5 further, the processor 130 may calculate the second SOC according to the voltage of the battery B using an equivalent circuit model. More specifically, the processor 130 may model voltage behaviors of the battery B as an equivalent circuit where OCV, an internal resistance and a resistor-capacitor parallel circuit are connected in series, and calculate the second SOC using a linear or nonlinear function and a current integration method in which factors of the equivalent circuit model are used as variables.

The second SOC of the battery B may also be calculated using a method other than the current integration method. For example, the processor 130 may calculate the second SOC of the battery B using measurement signals of the voltage, current and temperature of the battery B, which are received from the sensing unit 110 based on a Kalman filter or an Extended Kalman filter. As another example, the processor 130 may calculate the second SOC of the battery B using a state feedback filter and an observation feedback filter.

Here, the first SOC of the battery B is data calculated through a charge/discharge experiment and stored in the memory unit 120 in advance. Meanwhile, the second SOC of the battery B may be data calculated using measurement signals for the battery B at the present an equivalent circuit model electrically simulating the battery B.

Meanwhile, the processor 130 may calculate the second SOC for the entire voltage region of the battery B. As shown in FIG. 5, the SOC of the battery B may be expressed as an OCV-SOC graph where the X axis represents the second SOC and the Y axis represents the OCV throughout the entire voltage region of the battery B.

Hereinafter, the process in which the processor 130 estimates the SOC of the battery B in each of the first voltage region and the second voltage region will be described.

Figure 6:
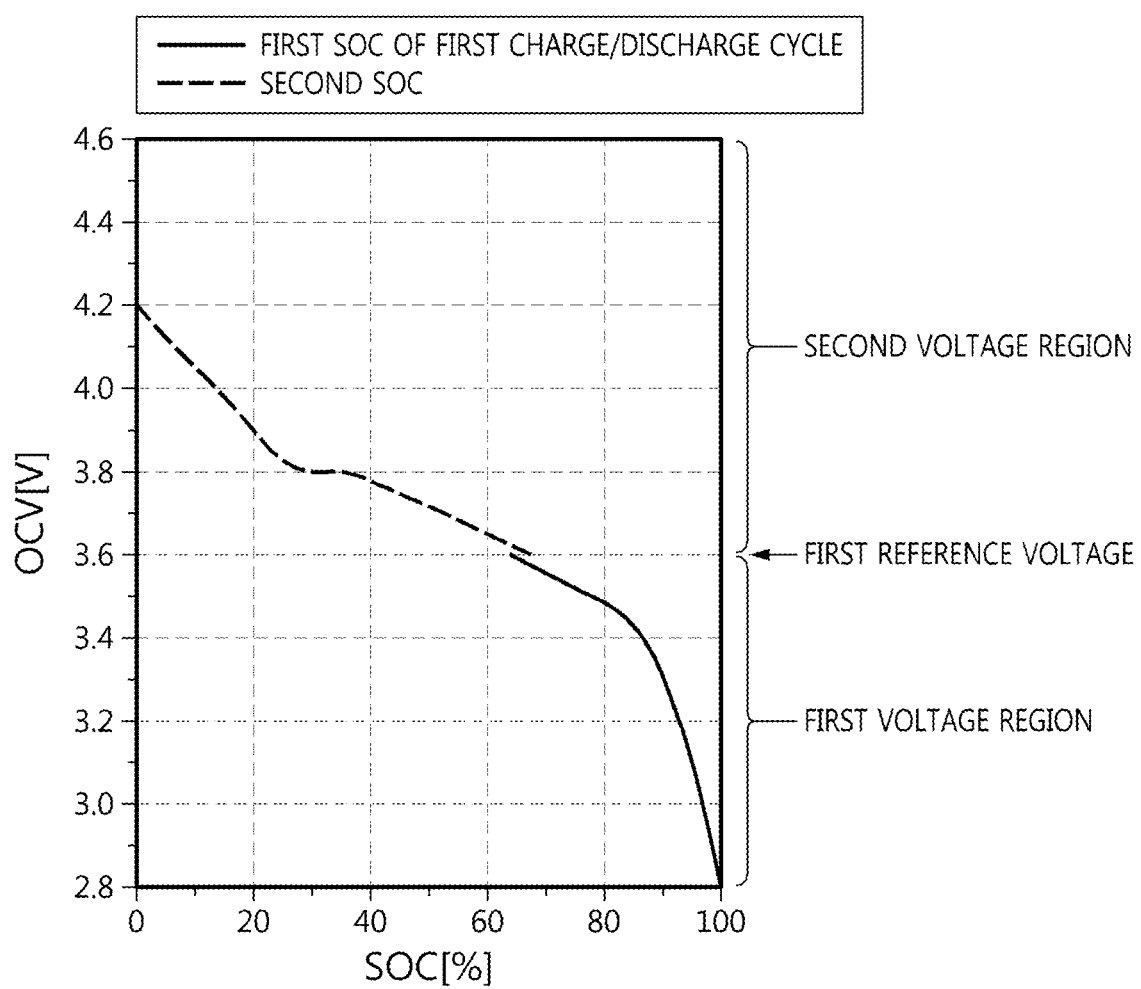
FIGS. 6 and 7 are graphs related to a process in which the battery SOC estimation apparatus depicted in FIG. 1 sets the first reference voltage, the second reference voltage, the first voltage region and the second voltage region and estimates the first SOC and the second SOC as a SOC of the battery.
Figure 7:
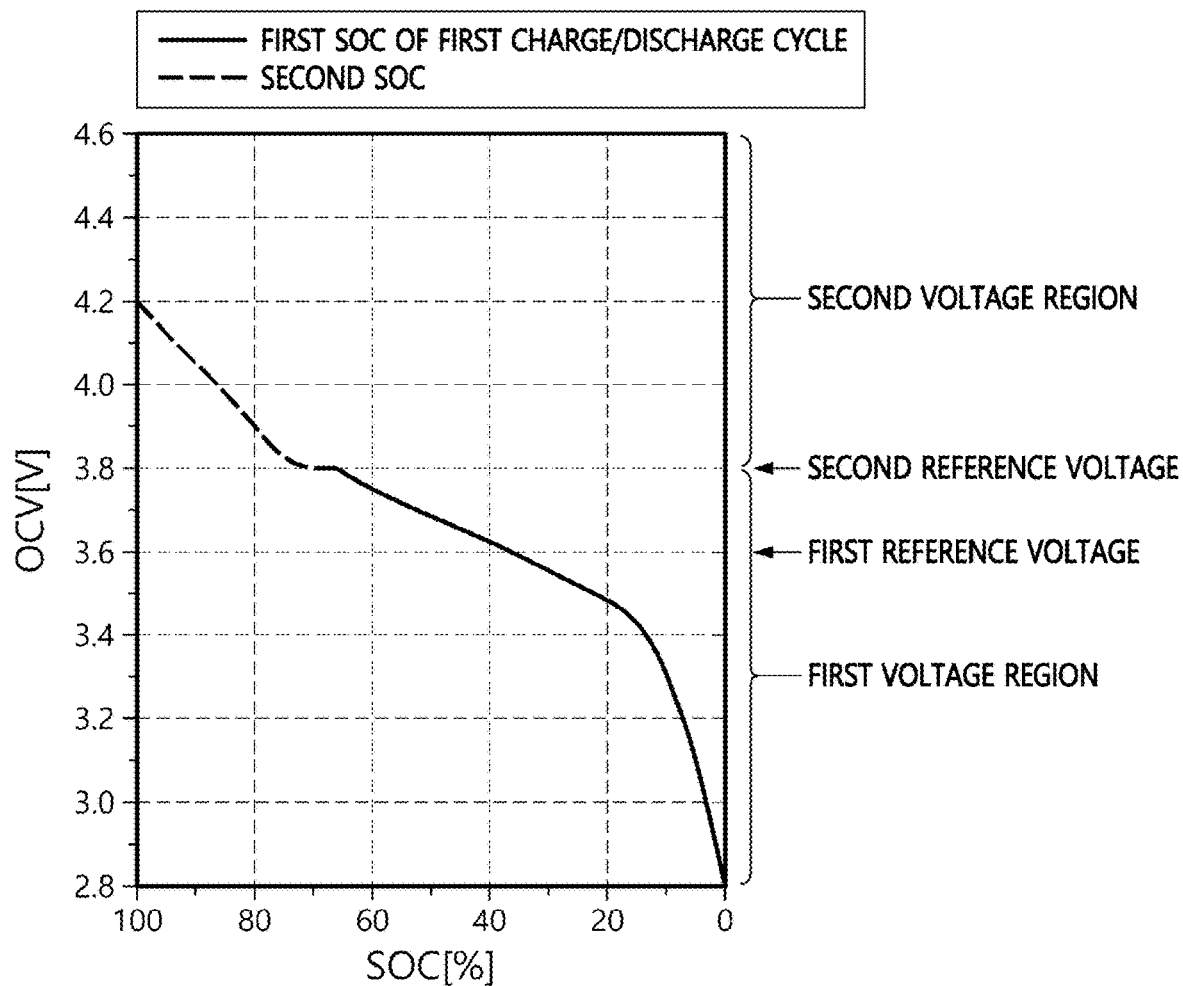

FIGS. 6 and 7 are graphs related to a process in which the battery SOC estimation apparatus depicted in FIG. 1 sets the first reference voltage, the second reference voltage, the first voltage region and the second voltage region and estimates the first SOC and the second SOC as a SOC of the battery.

Referring to FIGS. 6 and 7 further, the processor 130 may estimate the SOC of battery B in the first voltage region as the first SOC of the battery B and estimate the SOC of the battery B in the second voltage region as the second SOC of the battery B.

In other words, as shown in FIG. 6, the processor 130 may estimate the SOC of the battery B in the first voltage region as an initial SOC of the battery B, among the first SOC of the battery B calculated for each charge/discharge cycle through an charge/discharge experiment, namely the first SOC of the battery B calculated at the first charge/discharge cycle.

In addition, the processor 130 may estimate the SOC of the battery B in the second voltage region as the second SOC of the battery B calculated in real time using the equivalent circuit model.

Meanwhile, the processor 130 may calculate a voltage change rate of the battery B changing corresponding to the second SOC of the battery B and set the second reference voltage based on the increase and decrease of the calculated voltage change rate.

More specifically, the processor 130 may calculate the voltage change rate of the battery B changing corresponding to the second SOC of the battery B and set the voltage of the battery B, at which the calculated voltage change rate is changed from a positive value to a negative value or from a negative value to a positive value, as the second reference voltage.

For example, as shown in FIG. 5, the processor 130 may set the voltage "3.8V" of the battery B, at which the battery change rate of the battery B changes from a negative value to a positive value, as the second reference voltage.

If the second reference voltage is set, the processor 130 may set the first voltage region and the second voltage region using the first reference voltage and the second reference voltage. More specifically, the processor 130 may set a voltage region of the battery B equal to or lower than the first reference voltage as the first voltage region, set a voltage region higher than the first reference voltage as the second voltage region, and then further set a voltage region equal to or lower than the second reference voltage and higher than the first reference voltage as the first voltage region.

For example, as shown in FIG. 7, if the voltages "3.6V" and "3.8V" of the battery B are respectively set as the first reference voltage and the second reference voltage, the processor 130 may set a voltage region of the battery B equal to or lower than the first reference voltage "3.6V" as the first voltage region, set a voltage region of the battery B higher than the second reference voltage "3.8V" as the second voltage region, and then further set a voltage region equal to or lower than the second reference voltage "3.8V" and higher than the first reference voltage "3.6V" as the first voltage region.

After that, the processor 130 may estimate the SOC of the battery B in the first voltage region (0V to 3.8V) as an initial first SOC among the first SOCS of the battery B measured for each first charge/discharge cycle through the charge/discharge experiment, namely the first SOC of the battery B calculated at the first charge/discharge cycle.

In addition, the processor 130 may estimate the SOC of the battery B in the second voltage region (higher than 3.8V) as the second SOC of the battery B calculated in real time using the equivalent circuit model.

By doing so, the battery SOC estimation apparatus 100 according to the present disclosure may estimate the SOC with a minimized error by using the characteristics of the first SOC having a small difference between the first SOCs for each charge/discharge cycle in a specific voltage region and the characteristics of the second SOC calculated non-linearly in a specific voltage region.

In other words, the battery SOC estimation apparatus 100 may estimate the SOC of the battery B in the first voltage region as the first SOC of the battery B by setting a voltage region, in which a difference between the first SOC calculated at the first charge/discharge cycle and the first SOC calculated at another charge/discharge cycle is insignificant among the first SOCs for every charge/discharge cycle, as the first voltage region. In addition, the battery SOC estimating apparatus 100 may estimate the SOC of the battery B in the second voltage region as the second SOC by setting a voltage region, which is linearly calculated, other than the voltage region where the second SOC is calculated nonlinearly, as the second voltage region.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. An apparatus for estimating a state of charge (SOC) of a battery, comprising:
    a sensing unit configured to measure voltage, current, and temperature of a battery; and
    a processor operably coupled to the sensing unit, the processor being configured to:
        set a first reference voltage based on a first SOC according to a voltage of the battery, the first SOC being calculated in advance using the current of the battery measured at each of a plurality of charge/discharge cycles of the battery;
        calculate a second SOC according to the voltage of the battery using an equivalent circuit model corresponding to the battery;
        divide a voltage region of the battery into at least a first voltage region and a second voltage region the first reference voltage; and
        estimate an SOC of the battery based on the first SOC if the measured voltage of the battery is in the first voltage region and based on the second SOC if the measured voltage of the battery is in the second voltage region.

2. The apparatus for estimating an SOC of a battery according to claim 1, wherein the processor is further configured to:
    calculate an SOC deviation of the first SOCs for each charge/discharge cycle at a plurality of voltages of the battery within the voltage region of the battery; and
    set the first reference voltage based on the SOC deviation.

3. The apparatus for estimating an SOC of a battery according to claim 2, wherein the processor is further configured to set a voltage of the battery among the plurality of voltages, at which the SOC deviation is the smallest, as the first reference voltage.

4. The apparatus for estimating an SOC of a battery according to claim 1, wherein the processor is further configured to:
    set a voltage region of the battery equal to or lower than the first reference voltage as the first voltage region; and
    set a voltage region of the battery higher than the first reference voltage as the second voltage region.

5. The apparatus for estimating an SOC of a battery according to claim 1, wherein the processor is further configured to estimate the SOC of the battery in the first voltage region to be the first SOC calculated at an initial charge/discharge cycle among the plurality of charge/discharge cycles.

6. The apparatus for estimating an SOC of a battery according to claim 5, wherein the processor is further configured to estimate the SOC of the battery in the second voltage region to be the second SOC.

7. The apparatus for estimating an SOC of a battery according to claim 1, wherein the processor is further configured to:
    calculate a voltage change rate of the battery according to the second SOC; and
    set a second reference voltage based on an increase and decrease of the voltage change rate.

8. The apparatus for estimating an SOC of a battery according to claim 7, wherein the processor is further configured to set a voltage of the battery among a plurality of voltages of the battery within the voltage region of the battery, at which the voltage change rate increases and then decreases or decreases and then increases, as the second reference voltage.

9. The apparatus for estimating an SOC of a battery according to claim 7, wherein the processor is further configured to:
    set a voltage region of the battery equal to or lower than the first reference voltage to be included in the first voltage region;
    set a voltage region higher than the second reference voltage as the second voltage region; and further set a voltage region higher than the first reference voltage and equal to or lower than the second reference voltage to be included in the first voltage region.

10. A battery pack, comprising an apparatus for estimating an SOC of a battery according to claim 1.

11. The apparatus for estimating an SOC of a battery according to claim 1, wherein the processor is further configured to estimate the SOC of the battery to be the first SOC corresponding to the measured voltage of the battery if the measured voltage of the battery is in the first voltage region and to be the second SOC corresponding to the measured voltage of the battery if the measured voltage of the battery is in the second voltage region.

12. The apparatus for estimating an SOC of a battery according to claim 1, wherein the first voltage region does not overlap the second voltage region.

13. The apparatus for estimating an SOC of a battery according to claim 12, wherein:
   the first voltage region includes voltages equal to or lower than the first reference voltage, and
   the second voltage region includes voltages higher than the first reference voltage.

14. The apparatus for estimating an SOC of a battery according to claim 1, wherein the processor is further configured to estimate the SOC of the battery:
   based on the first SOC and not on the second SOC if the measured voltage of the battery is in the first voltage region; and
   based on the second SOC and not on the first SOC if the measured voltage of the battery is in the second voltage region.

* * * * *